(12) United States Patent
Takano et al.

(10) Patent No.: US 9,184,312 B2
(45) Date of Patent: Nov. 10, 2015

(54) SOLAR POWER GENERATION DEVICE

(75) Inventors: Tomihiro Takano, Tokyo (JP); Masashi Fujitsuka, Tokyo (JP); Naoki Nishio, Tokyo (JP); Naoto Shimada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1189 days.

(21) Appl. No.: 13/002,724

(22) PCT Filed: Jul. 8, 2008

(86) PCT No.: PCT/JP2008/062349
§ 371 (c)(1),
(2), (4) Date: Jan. 5, 2011

(87) PCT Pub. No.: WO2010/004622
PCT Pub. Date: Jan. 14, 2010

(65) Prior Publication Data
US 2011/0127839 A1 Jun. 2, 2011

(51) Int. Cl.
*H02J 1/10* (2006.01)
*H01L 31/02* (2006.01)

(52) U.S. Cl.
CPC ........... *H01L 31/02021* (2013.01); *Y02E 10/50* (2013.01); *Y10T 307/685* (2015.04)

(58) Field of Classification Search
CPC .... H02M 2001/007; H02J 9/02; H02J 7/0052
USPC ....................... 307/77; 136/243, 244; 320/101
See application file for complete search history.

(56) References Cited

U.S. PATENT DOCUMENTS

| | | | |
|---|---|---|---|
| 6,512,458 B1 * | 1/2003 | Kobayashi et al. | 340/635 |
| 6,515,215 B1 * | 2/2003 | Mimura | 136/244 |
| 6,545,211 B1 * | 4/2003 | Mimura | 136/244 |
| 7,082,019 B2 * | 7/2006 | Bodeau et al. | 361/82 |

(Continued)

FOREIGN PATENT DOCUMENTS

| | | | | |
|---|---|---|---|---|
| DE | 93 12 710 U1 | 10/1993 | | |
| DE | 9312710 U1 * | 10/1993 | ............. | G01R 31/26 |

(Continued)

OTHER PUBLICATIONS

Extended European Search Report issued Jan. 16, 2014 in Patent Application No. 08790986.7.

(Continued)

*Primary Examiner* — Jared Fureman
*Assistant Examiner* — Alfonso Perez Borroto
(74) *Attorney, Agent, or Firm* — Oblon, McClelland, Maier & Neustadt, L.L.P.

(57) ABSTRACT

A transmitting circuit is connected to a power line at current flow-in sides to solar battery strings, and a receiving circuit is connected to the power line at current flow-out sides to the solar battery strings. An attenuating circuit connected in series to a bypass diode is provided in a bypass circuit. The transmitting circuit transmits a periodic signal of a predetermined frequency to the power line. The receiving circuit receives via the solar battery strings a transmission signal transmitted from the transmitting circuit to the power line. A determining circuit determines that, when it is detected that an amplitude of a transmission signal received by the receiving circuit is attenuated by a predetermined value or more, direct-current power is conducted to the bypass circuit.

11 Claims, 7 Drawing Sheets

(56) References Cited

U.S. PATENT DOCUMENTS

| | | | |
|---|---|---|---|
| 7,772,716 B2* | 8/2010 | Shaver et al. | 307/31 |
| 7,825,325 B2* | 11/2010 | Kennedy et al. | 136/244 |
| 2003/0062078 A1 | 4/2003 | Mimura | |
| 2003/0063008 A1 | 4/2003 | Kobayashi et al. | |
| 2005/0105224 A1* | 5/2005 | Nishi | 361/18 |
| 2005/0139258 A1* | 6/2005 | Liu et al. | 136/293 |
| 2007/0159866 A1* | 7/2007 | Siri | 363/95 |
| 2007/0221267 A1* | 9/2007 | Fornage | 136/244 |
| 2010/0007212 A1* | 1/2010 | Zanarini et al. | 307/82 |

FOREIGN PATENT DOCUMENTS

| | | |
|---|---|---|
| JP | 6 125105 | 5/1994 |
| JP | 7 177652 | 7/1995 |
| JP | 8 97456 | 4/1996 |
| JP | 8 185235 | 7/1996 |
| JP | 9 102622 | 4/1997 |
| JP | 11 330521 | 11/1999 |
| JP | 2000 59986 | 2/2000 |
| JP | 2000 196127 | 7/2000 |
| JP | 2000 269531 | 9/2000 |
| JP | 2001 68706 | 3/2001 |
| JP | 2003 142707 | 5/2003 |
| JP | 2004 221479 | 8/2004 |

OTHER PUBLICATIONS

International Search Report issued Aug. 5, 2008 in PCT/JP08/062349 filed Jul. 8, 2008.

* cited by examiner

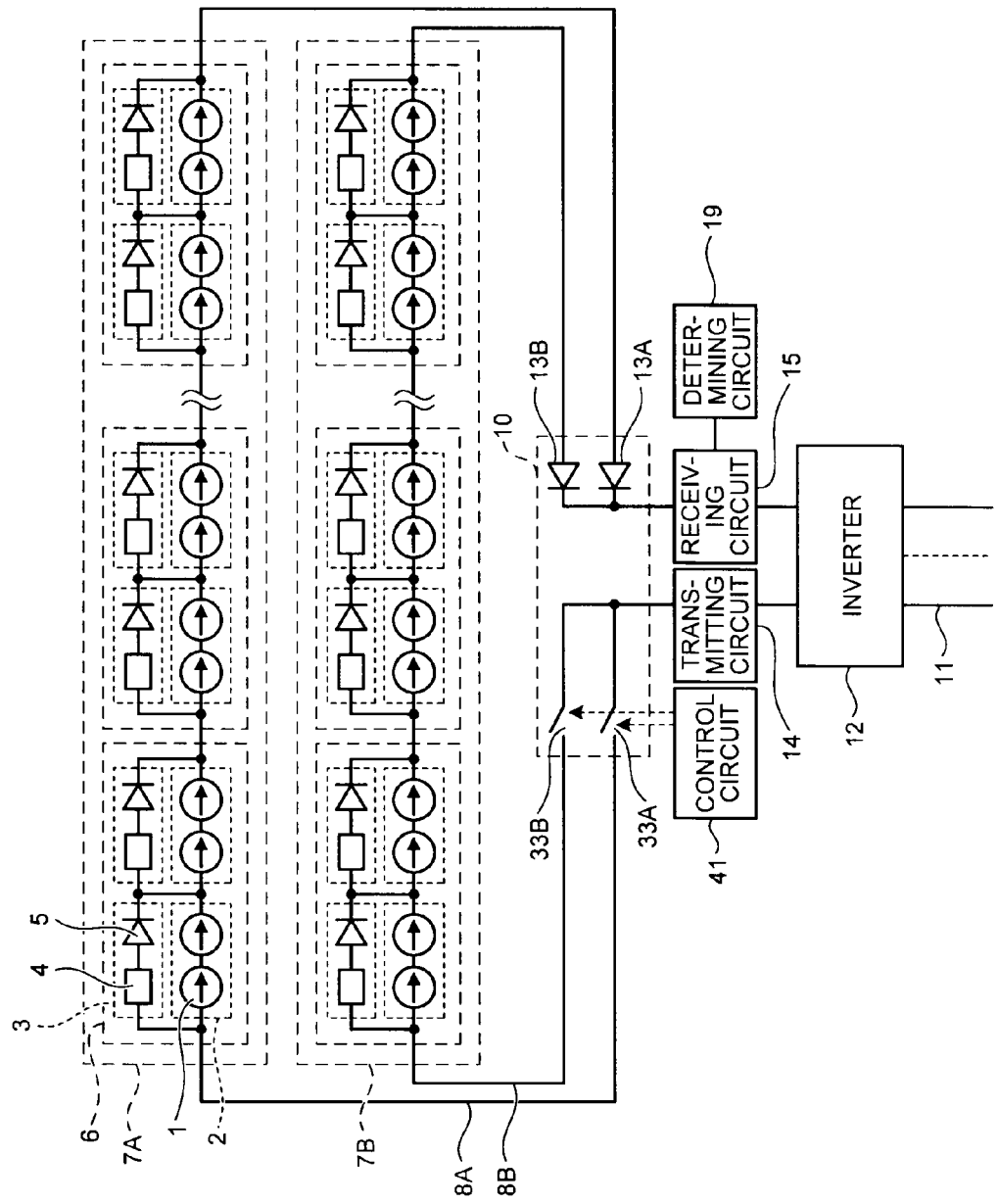

SOLAR POWER GENERATION DEVICE

TECHNICAL FIELD

The present invention relates to a solar power generation device, and more particularly relates to a failure detecting method of a solar power generation device constructed by using plural solar cells in order to obtain desired power.

BACKGROUND ART

A solar power generation device using solar cells has a parallel connection of solar battery strings, each of which is constructed by a series connection of solar battery modules having these solar cells mounted thereon in order to obtain desired power. When a solar cell mounted on a solar battery module has a failure or when electromotive force of a solar cell becomes a predetermined value or lower because sunlight is blocked, to prevent current conduction of other solar cells connected in series to this solar cell, a bypass circuit is connected in parallel for each connection unit having one or more solar cells electrically connected in series or in parallel.

A bypass diode is provided in the bypass circuit, and when a solar cell normally generates power, electromotive force of the solar cell is applied to the bypass diode as an inverse bias voltage. Accordingly, power can be taken out from the solar cell without via a bypass circuit, disabling a bypass operation of the bypass circuit and keeping the bypass diode in a blocked state.

When an abnormality such as a disconnection and a reduction of electromotive force occurs in a part of solar cells within a solar battery string and then this solar cell cannot normally generate power, a current from a normal solar cell within the solar battery string passes via the bypass diode which is in parallel with this abnormal solar cell. By bypassing this abnormal solar cell, a situation that all solar cells within the solar cell string become unusable due to the abnormality of one solar cell is prevented.

When a failure occurs in a solar cell, an original generation amount of the solar power generation device can be secured by replacing a solar battery module having the defective solar cell mounted thereon. As a method of detecting such a failure of a solar cell, a method of detecting a current conduction operation to a bypass circuit has been known.

As a method of detecting a failure of a solar cell, there is a method of comparing between output voltages of solar battery strings connected in parallel, and determining that there is an abnormality in a certain solar cell module within a solar cell string having a low output voltage (Patent Document 1).

There is a method of easily detecting a failure of a solar cell panel or an electromotive-force shortage, by providing a light emitter such as a light-emitting diode in the middle of a bypass circuit, and causing the light emitter to emit light when a current flows through the bypass circuit (Patent Document 2).

There is a method of remote-monitoring a relay operation via a communication line, by providing a current detection relay in the middle of a bypass circuit (Patent Document 3).

There is a method of providing a specific-frequency transmitting circuit in each solar battery module, and causing this circuit to superimpose a signal of a specific frequency on a power line connecting solar battery modules depending on whether a solar battery module is normally generating power (Patent Document 4). In this method, during a normal time when a voltage of a solar battery module is at or above a certain voltage, transmission of a signal of a specific frequency superimposed on a power line is enabled by causing the solar battery module to supply power to the specific-frequency transmitting circuit. When a voltage of a solar battery module becomes lower than a certain voltage due to a failure or the like, power supply to the specific-frequency transmitting circuit is stopped, thereby preventing the signal of the specific frequency to be transmitted from being superimposed on a power line. A signal separating unit takes out the signal of the specific frequency, thereby making it possible to determine presence of a failure of a solar battery module or presence of an electromotive-force shortage.

In this method, a solar battery module having a failure or electromotive-force shortage can be identified by changing for each solar battery module a transmission frequency of the specific-frequency transmitting circuit. The specific-frequency transmitting circuit can suppress the power consumption required for a transmission by performing the transmission on a periodic basis, e.g., at an interval of 30 minutes, at an interval of an hour, or at an interval of a day, instead of always transmitting the signal while solar battery modules are operating.

Patent Document 1: Japanese Patent Application Laid-open No. H08-185235

Patent Document 2: Japanese Patent Application Laid-open No. H08-97456

Patent Document 3: Japanese Patent Application Laid-open No. H09-102622

Patent Document 4: Japanese Patent Application Laid-open No. 2000-269531

DISCLOSURE OF INVENTION

Problem to be Solved by the Invention

However, according to the conventional technique in Patent Document 1 mentioned above, an influence on an output voltage of the entire solar battery strings is small even when a certain solar battery module has a disconnection failure or is in an electromotive-force shortage. An output voltage also changes due to an individual difference of solar battery modules, due to a difference or a variation of an amount of solar radiation at an installation position or the like. Therefore, by only monitoring a variation of an output voltage of solar battery strings, it is difficult to stably determine a disconnection failure or an electromotive-force shortage of solar battery modules.

According to the conventional technique in Patent Document 2 mentioned above, a light emission of a light emitter needs to be visually confirmed to detect a failure or electromotive-force shortage of a solar cell panel. Therefore, an automatic detection of a failure of a solar cell panel is difficult and, when solar battery modules are installed on a roof or at a remote place, visual confirmation itself of a light emission becomes difficult, and this has a problem in detecting a failure of solar cell panels.

According to the conventional technique in Patent Document 3 mentioned above, a current detection relay is necessary for each bypass circuit, and thus a signal line that communicates an operation of the current detection relay is necessary in addition to a power line. This results in cost increase.

According to the conventional technique in Patent Document 4 mentioned above, a specific-frequency transmitting circuit and an electric parameter detecting unit are necessary for each solar battery module. This causes cost increase, and also increases the power consumption because the specific-frequency transmitting circuit always transmits a signal while a solar battery module is operating normally.

When a periodic transmission method is employed to suppress the power consumption, a timer and a clock need to be installed in each solar battery module, and a signal line that regularly instructs transmission start and transmission stop needs to be connected to each solar battery module. This results in cost increase.

According to the conventional techniques in Patent Documents 1 to 4 mentioned above, power generated by a solar battery module is used as power necessary for a failure detecting operation. Therefore, when generated power is small, there is a problem that sufficient power necessary for a failure detecting operation cannot be obtained and thus the operation becomes unstable.

The present invention has been made in view of the above, and an object of the present invention is to obtain a solar power generation device capable of stably detecting an abnormality of a solar battery module without consuming power generated by the solar battery module in each bypass circuit.

Means for Solving Problem

To solve the problem described above and achieve the object, a solar power generation device includes: one or more solar cells electrically connected in series or in parallel to form a connection unit; and a bypass circuit that is connected in parallel to the connection unit and performs a conduction operation by bypassing the connection unit when electromotive force of the connection unit is equal to or lower than a predetermined value, wherein a solar battery string is formed by electrically connecting in series one or more solar battery modules, each of which is equipped with one or more sets of combination of the connection unit and the bypass circuit, and the solar battery string is connected in one or more rows in parallel by a power line, and the solar power generation device further includes: a transmitting circuit that transmits a transmission signal of a predetermined amplitude to the power line; a receiving circuit that receives via the solar battery string a transmission signal transmitted to the power line; and an attenuating circuit that is provided in the bypass circuit and attenuates an amplitude of the transmission signal.

Effect of the Invention

According to the present invention, an abnormality of a solar battery module can be stably detected without consuming power generated by the solar battery module in each bypass circuit.

BRIEF DESCRIPTION OF DRAWINGS

FIG. 9 is a block diagram of a schematic configuration of a solar power generation device according to a fourth embodiment of the present invention.

EXPLANATIONS OF LETTERS OR NUMERALS

Figure 1:
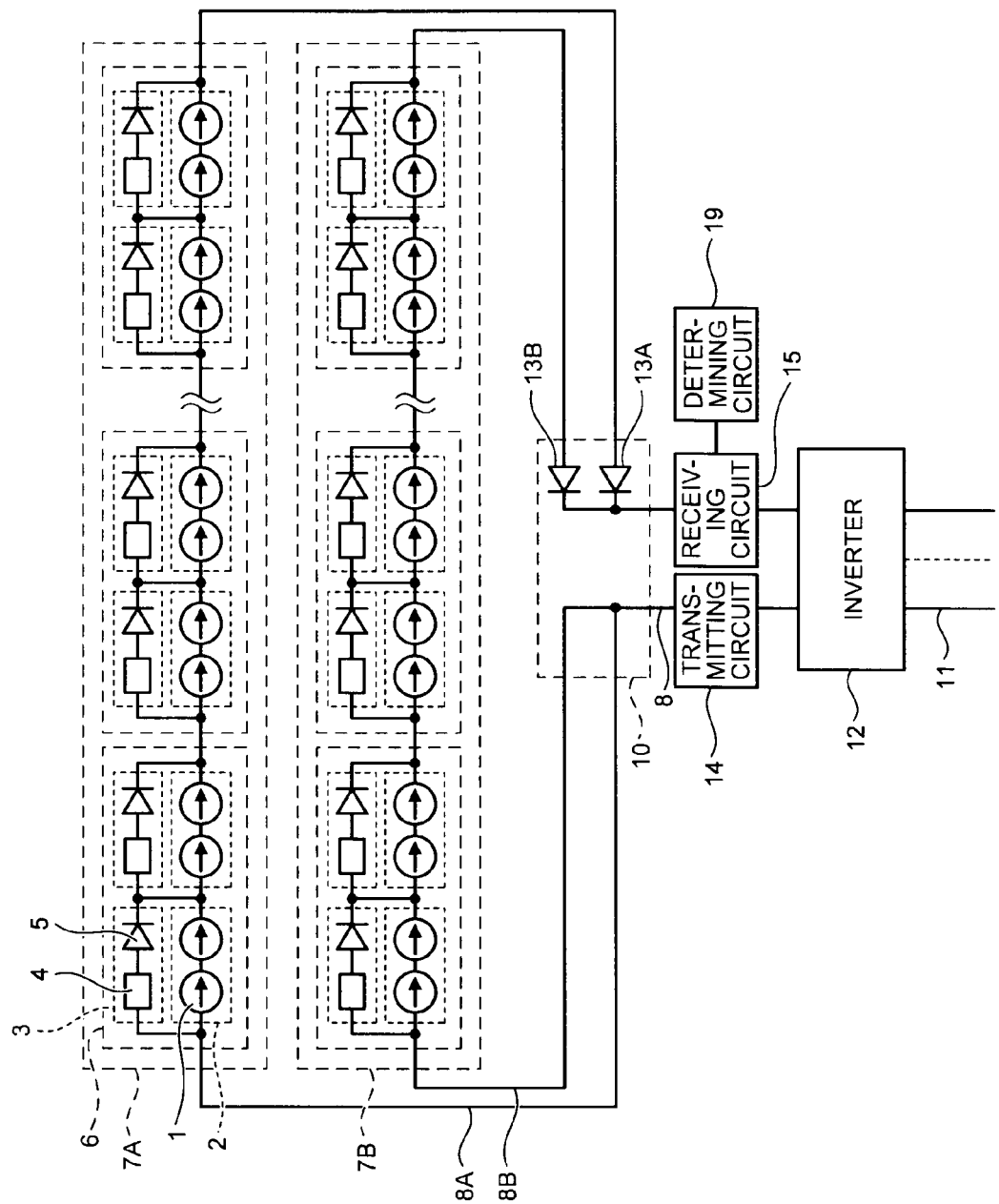
FIG. 1 is a block diagram of a schematic configuration of a solar power generation device according to a first embodiment of the present invention.

1 Solar cell
2 Connection unit
3 Bypass circuit
4, 32A, 32B Attenuating circuit
5 Bypass diode
6 Solar battery module
7A, 7B Solar battery string
8, 8A, 8B Power line
9A Bypass power line
10 Connection box
11 Alternating-current line
12 Inverter
13A, 13B Backflow prevention diode
14 Transmitting circuit
15 Receiving circuit
16 Coil
17 Transmitting switch
18 Periodic power source
19 Determining circuit
30, 36 Capacitor
31, 37 Resistor
33A, 33B Switch
34, 35 Changeover switch
41 Control circuit Best Mode(S) For Carrying Out The Invention Exemplary embodiments of a solar power generation device according to the present invention will be explained below in detail with reference to the accompanying drawings. The present invention is not limited to the embodiments.

First Embodiment

FIG. 1 is a block diagram of a schematic configuration of a solar power generation device according to a first embodiment of the present invention. In FIG. 1, solar battery strings 7A and 7B each having solar battery modules 6 electrically connected in series are provided in the solar power generation device. Each of the solar battery modules 6 is a hardware that is the unit for separation. Installation or replacement can be performed for each of the solar battery modules 6.

Power lines 8A and 8B are drawn out from the solar battery strings 7A and 7B, respectively, and the power lines 8A and 8B are connected in common to a power line 8, thereby connecting the solar battery strings 7A and 7B in parallel.

Solar cells 1, each of which is caused to generate electric power by sunlight, and bypass circuits 3 are provided in the solar battery modules 6. A connection unit 2 is formed by having one or more solar cells 1 electrically connected in series or in parallel. The bypass circuits 3 are connected in parallel to the connection units 2. Each of the bypass circuits 3 can perform a current conduction operation by bypassing the connection unit 2 when an electromotive voltage of the connection unit 2 is equal to or lower than a predetermined value.

A connection box 10 that connects the power line 8 to an inverter 12, and the inverter 12 that converts a direct current to an alternating current are provided in the solar power generation device. The power line 8 is connected to the inverter 12 via the connection box 10, and an alternating-current line 11 outputting an alternating current is drawn out from the inverter 12. Backflow prevention diodes 13A and 13B are provided in the connection box 10. The backflow prevention diodes 13A and 13B are connected in series to current flow-out sides to the solar battery strings 7A and 7B, respectively.

A transmitting circuit 14, a receiving circuit 15, and a determining circuit 19 are provided in the solar power generation device. The transmitting circuit 14 is connected to the power line 8 at current flow-in sides to the solar battery strings 7A and 7B between the connection box 10 and the inverter 12, and the receiving circuit 15 is connected to the power line 8 at current flow-out sides to the solar battery strings 7A and 7B between the connection box 10 and the inverter 12. The determining circuit 19 is connected to the receiving circuit 15.

The transmitting circuit 14 can transmit a transmission signal of a predetermined amplitude to the power line 8. A periodic signal of a predetermined frequency can be used for the transmission signal. The receiving circuit 15 can receive via the solar battery strings 7A and 7B the transmission signal transmitted from the transmitting circuit 14 to the power line 8. The receiving circuit 15 can be configured to detect a periodic signal by performing an analog-to-digital conversion with a voltmeter, an ammeter, and a CT converter. Alternatively, the receiving circuit 15 can be a unit that detects a periodic signal by using an algorithm of Fourier transform or the like, or a spectrum analyzer can be used.

The determining circuit 19 can determine that, when it is detected that an amplitude of a transmission signal received by the receiving circuit 15 is attenuated by a predetermined value or more, direct-current power is conducted to the bypass circuit 3. Alternatively, the determining circuit 19 can determine that, when it is continuously detected for a certain time or more that an amplitude of a transmission signal received by the receiving circuit 15 is attenuated by a predetermined value or more, direct-current power is conducted to the bypass circuit 3.

An attenuating circuit 4 and a bypass diode 5 are provided in each of the bypass circuits 3. The attenuating circuit 4 and the bypass diode 5 are connected in series. Series circuits of the attenuating circuits 4 and the bypass diodes 5 are connected in parallel to the connection units 2 such that cathodes of the bypass diodes 5 are connected to current flow-out sides of the solar cells 1. The attenuating circuits 4 can attenuate amplitudes of transmission signals transmitted from the transmitting circuit 14 to the power line 8. A lowpass filter or a bandpass filter can be used for the attenuating circuits 4.

A periodic signal transmitted from the transmitting circuit 14 can have plural frequency components. When a periodic signal has plural frequency components, the periodic signal can have the frequency components in a time-sharing manner.

Attenuation characteristics of the attenuating circuits 4 can be set such that frequencies of periodic signals attenuated by the attenuating circuits 4 are different between solar battery modules 6. For example, the number of frequency components of periodic signals can be set corresponding to the number of the solar battery modules 6. Attenuation characteristics of the attenuating circuits 4 can be set such that frequencies of periodic signals attenuated by the attenuating circuits 4 are different between the solar battery modules 6.

Alternatively, frequencies of periodic signals and attenuation characteristics of the attenuating circuits 4 can be set for each of the solar battery strings 7A and 7B. For example, periodic signals have frequencies F1 and F2 (F2>F1). Attenuation characteristics of the attenuating circuits 4 of the solar battery string 7A are set such that periodic signals of the frequency F1 are attenuated, and attenuation characteristics of the attenuating circuits 4 of the solar battery string 7B are set such that periodic signals of the frequency F2 are attenuated.

An example is explained below in which periodic signals are set to have frequencies F1 and F2, attenuation characteristics of the attenuating circuits 4 of the solar battery string 7A are set such that periodic signals of the frequency F1 are attenuated, and attenuation characteristics of the attenuating circuits 4 of the solar battery string 7B are set such that periodic signals of the frequency F2 are attenuated. The frequencies set in the periodic signals are not necessarily limited to two kinds. Three kinds of frequencies can be set in the periodic signals, and attenuation characteristics of the attenuating circuits 4 can be set for each of the solar battery strings 7A and 7B or for each of the solar battery modules 6 according to the three kinds of frequencies.

When sunlight is incident to the solar cells 1, electromotive force is generated in the solar cells 1. Currents generated by the electromotive force flow in a certain direction, and direct-current voltages of the same number of the solar cells 1 connected in series in each of the solar battery strings 7A and 7B are supplied to the inverter 12 via the power line 8. When direct-current voltages are supplied to the inverter 12 via the power line 8, the inverter 12 converts the direct-current voltages into alternating-current voltages and outputs the alternating-current voltages via the alternating-current line 11.

The transmitting circuit 14 generates periodic signals having the frequencies F1 and F2, for example, transmits the periodic signals having the frequencies F1 and F2 to the power line 8 in a time-sharing manner, and inputs the periodic signals to the solar battery strings 7A and 7B via the power lines 8A and 8B, respectively.

The periodic signals input to the solar battery strings 7A and 7B pass through the solar battery strings 7A and 7B, and are input to the receiving circuit 15 via the power line 8. The receiving circuit 15 detects for each of the frequencies F1 and F2 attenuation amounts of the periodic signals transmitted from the transmitting circuit 14.

When electromotive force of a predetermined or larger value is generated in the solar cell 1, an inverse bias voltage is applied to the bypass diode 5. Therefore, the bypass diode 5 is held in a blocked state, and electromotive force generated from the solar cell 1 is supplied to the inverter 12 without a bypass operation by the bypass circuit 3. When the bypass diode 5 is held in a blocked state, periodic signals transmitted from the transmitting circuit 14 reach the receiving circuit 15 without passing through any attenuating circuit 4 of the solar battery strings 7A and 7B. Therefore, the receiving circuit 15 detects that an attenuation amount of the periodic signals transmitted from the transmitting circuit 14 is substantially zero. When an attenuation amount of the periodic signals transmitted from the transmitting circuit 14 is detected as substantially zero, the determining circuit 19 determines that direct-current power is not conducted to any of the bypass circuits 3 of the solar battery strings 7A and 7B, and determines that there is no unrecoverable failure in any of the solar battery modules 6 of the solar battery strings 7A and 7B.

In contrast, when a failure such as a disconnection occurs in a certain solar cell 1 of any of the solar battery modules 6 of the solar battery string 7A, electromotive force generated from this solar cell 1 becomes equal to or lower than a predetermined value. When electromotive force generated from a certain solar cell 1 of the solar battery string 7A becomes equal to or lower than a predetermined value, a current flows via the bypass diode 5 within the bypass circuit 3 connected in parallel to the connection unit 2 formed by the solar cell 1, and electromotive force generated from the solar cells 1 in which no failure occurs is supplied to the inverter 12.

In the solar battery string 7A, when a current flows via the bypass diode 5 within the bypass circuit 3 connected in parallel to the connection unit 2 formed by the solar cell 1 in which a failure occurs, a current also flows in the attenuating circuit 4 within this bypass circuit 3. A periodic signal transmitted from the transmitting circuit 14 reaches the receiving circuit 15 via the attenuating circuit 4 within the bypass circuit 3 connected in parallel to the connection unit 2 formed by the solar cell 1 in which the failure occurs.

Therefore, the receiving circuit 15 detects that an attenuation amount of a component of the frequency F1 of the periodic signal transmitted from the transmitting circuit 14 exceeds a prescribed value, and detects that an attenuation amount of a component of the frequency F2 is substantially zero. When it is detected that an attenuation amount of a component of the frequency F1 of the periodic signal exceeds a prescribed value, the determining circuit 19 determines that direct-current power is conducted to any of the bypass circuits 3 of the solar battery string 7A, and determines that there is an unrecoverable failure in any of the solar battery modules 6 of the solar battery string 7A.

When a failure such as a disconnection occurs in a certain solar cell 1 of any of the solar battery modules 6 of the solar battery string 7B, electromotive force generated from this solar cell 1 becomes equal to or lower than a predetermined value. When electromotive force generated from a certain solar cell 1 of the solar battery string 7B becomes equal to or lower than a predetermined value, a current flows via the bypass diode 5 within the bypass circuit 3 connected in parallel to the connection unit 2 formed by the solar cell 1, and electromotive force generated from the solar cells 1 in which no failure occurs is supplied to the inverter 12.

In the solar battery string 7B, when a current flows via the bypass diode 5 within the bypass circuit 3 connected in parallel to the connection unit 2 formed by the solar cell 1 in which a failure occurs, a current also flows in the attenuating circuit 4 within this bypass circuit 3. A periodic signal transmitted from the transmitting circuit 14 reaches the receiving circuit 15 via the attenuating circuit 4 within the bypass circuit 3 connected in parallel to the connection unit 2 formed by the solar cell 1 in which the failure occurs.

Therefore, the receiving circuit 15 detects that an attenuation amount of a component of the frequency F2 of the periodic signal transmitted from the transmitting circuit 14 exceeds a prescribed value, and detects that an attenuation amount of a component of the frequency F1 is substantially zero. When it is detected that an attenuation amount of a component of the frequency F2 of the periodic signal exceeds a prescribed value, the determining circuit 19 determines that direct-current power is conducted to any of the bypass circuits 3 of the solar battery string 7B, and determines that there is an unrecoverable failure in any of the solar battery modules 6 of the solar battery string 7B.

Direct-current power is also conducted to the bypass circuit 3 also when the amount of solar radiation decreases. The solar cell 1 is naturally restored when an amount of solar radiation is restored. Therefore, to prevent an erroneous determination that the solar battery 6 has a failure when the amount of solar radiation decreases, it can be determined such that, when it is determined that direct-current power is continuously conducted to the bypass circuit 3 at the same position for a certain period of time, there is an recoverable failure in any of the solar battery modules 6 of the solar battery strings 7A and 7B.

Further, for example, when the whole of the solar battery string 7A is shaded or when a failure occurs in the solar battery module 6 of the solar battery string 7A, a voltage generated in the solar battery string 7A decreases and a voltage difference is generated between the solar battery strings 7A and 7B. In this case, the backflow prevention diode 13A can prevent a phenomenon that a current output from the solar battery string 7B flows back to the solar battery string 7A. Therefore, by providing the backflow prevention diode 13A, direct-current power can be taken out from the solar battery string 7B even when direct-current power cannot be taken out from the solar battery string 7A. This similarly applies to the backflow prevention diode 13B.

Accordingly, a failure of the solar battery module 6 can be detected without providing in each of the bypass circuits 3 a current detection relay or a specific-frequency transmitting circuit. A failure can be monitored by supplying power to the transmitting circuit 14 and the receiving circuit 15, and power does not need to be supplied to the attenuating circuit 4. Consequently, increase of the power consumption and cost can be suppressed. An abnormality of solar battery modules can be stably and easily detected even when the solar battery modules are installed on a roof or at a remote place.

In the first embodiment shown in FIG. 1, a configuration having only two rows of the solar battery strings 7A and 7B connected in parallel is shown. The number of rows of solar battery strings connected in parallel is not limited to two, and can be any number when one or more rows of solar battery strings are connected in parallel. In the first embodiment shown in FIG. 1, although a configuration having two solar cells 1 provided in the connection unit 2 is shown, the number of the solar cells 1 that form the connection unit 2 is not limited to two, and any number of the solar cell 1 can be provided when at least one solar cell 1 is provided in the connection unit 2. In the first embodiment shown in FIG. 1, although a configuration having two connection units 2 provided in the solar battery module 6 is shown, the number of the connection unit 2 provided in the solar battery module 6 is not limited to two, and any number of the connection unit 2 can be provided when at least one connection unit 2 is provided in the solar battery module 6.

In the first embodiment shown in FIG. 1, an example is explained that attenuation characteristics of the attenuating circuits 4 of the solar battery strings 7A and 7B are set such that periodic signals of the frequencies F1 and F2 are attenuated by providing two kinds of the frequencies F1 and F2 in the periodic signals. When there are N (N is an integer equal to or larger than 1) solar battery strings, attenuation characteristics of the attenuating circuits 4 of the N solar battery strings can be set such that periodic signals of frequencies F1 to FN are attenuated respectively by providing N kinds of the frequencies F1 to FN in the periodic signals.

When there are N solar battery strings and also when there are M (M is an integer equal to or larger than 1) solar battery modules in each of the solar battery strings, attenuation characteristics of the attenuating circuits 4 of M×N solar battery strings can be set such that periodic signals of frequencies F11 to FMN are attenuated respectively by providing M×N kinds of the frequencies F11 to FMN in the periodic signals.

The transmitting circuit 14 and the receiving circuit 15 can be incorporated in the inverter 12 or in the connection box 10, or plural inverters 12 can be connected to the power line 8.

Figure 2:
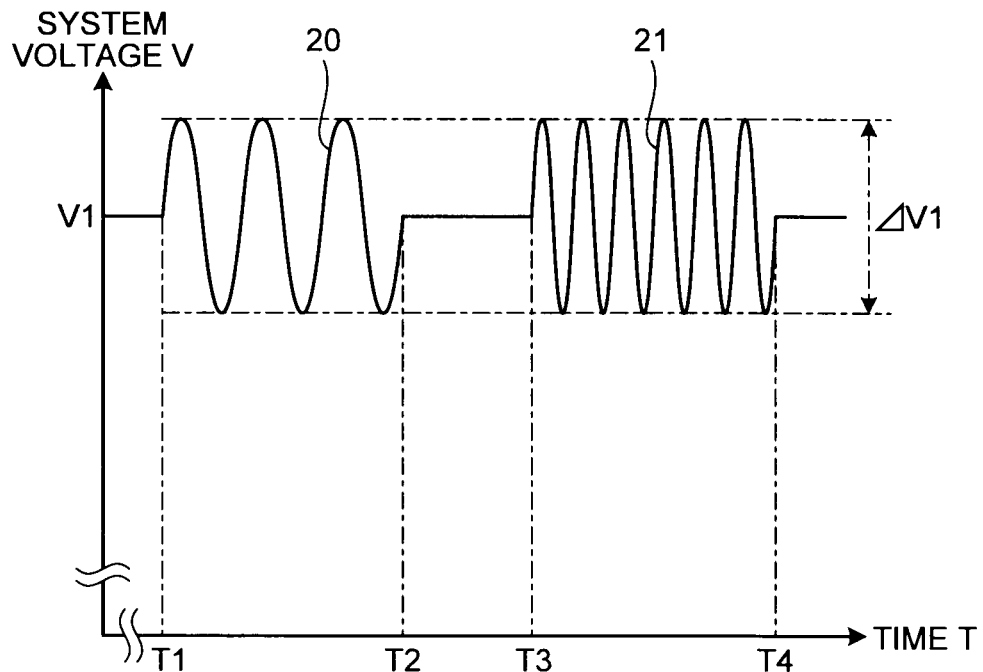
FIG. 2 depicts a waveform of a periodic signal when no failure occurs in any of solar cells 1 shown in FIG. 1.

FIG. 2 depicts a waveform of a periodic signal when no failure occurs in any of solar cells 1 shown in FIG. 1. A system voltage V is a voltage at both ends of the power line 8 connected to the inverter 12 shown in FIG. 1.

Assume that, in FIG. 2, the system voltage V is V1 when no failure occurs in any of the solar cells 1 shown in FIG. 1. When periodic signals of the frequencies F1 and F2 are transmitted in a time-sharing manner from the transmitting circuit 14 to the power line 8, a periodic signal 20 of the frequency F1 and an amplitude ΔV1 is superimposed on the system voltage V1 during a period from time T1 to T2, and is input to the solar battery strings 7A and 7B. Also, a periodic signal 21 of the frequency F2 and the amplitude ΔV1 is superimposed on the system voltage V1 during a period from time T3 to T4, and is input to the solar battery strings 7A and 7B.

When a failure does not occur in any of the solar cells 1 shown in FIG. 1, the periodic signals 20 and 21 transmitted from the transmitting circuit 14 reach the receiving circuit 15 without passing through any attenuating circuit 4 of the solar battery strings 7A and 7B. Therefore, the receiving circuit 15 detects that amplitudes of the periodic signals 20 and 21 transmitted from the transmitting circuit 14 are substantially ΔV1, and determines that attenuation amounts of the periodic signals 20 and 21 are substantially zero. When it is determined that the attenuation amounts of the periodic signals transmitted from the transmitting circuit 14 are substantially zero, the determining circuit 19 can determine that direct-current power is not conducted to the bypass circuit 3, and can determine that there is no unrecoverable failure in any of the solar battery modules 6 of the solar battery strings 7A and 7B.

Figure 3:
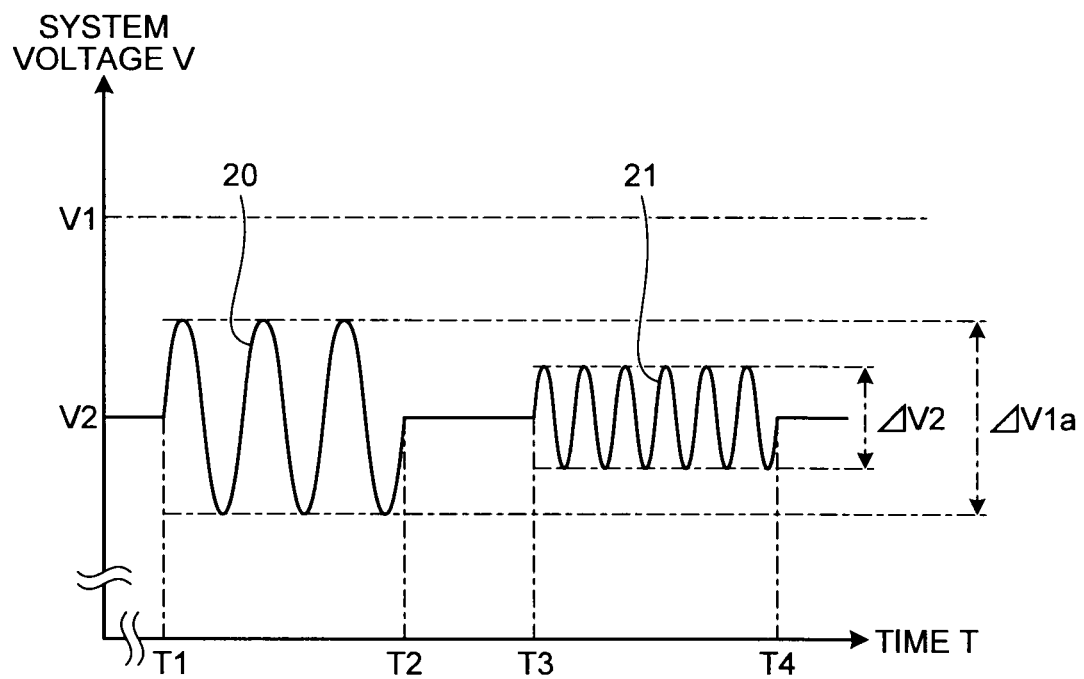
FIG. 3 depicts a waveform of a periodic signal when a failure occurs in any of the solar cells 1 shown in FIG. 1.

FIG. 3 depicts a waveform of a periodic signal when a failure occurs in any of the solar cells 1 shown in FIG. 1. In FIG. 3, when a failure such as a disconnection occurs in a certain solar cell 1 of any of the solar battery modules 6 of the solar battery string 7B, for example, electromotive force generated from this solar cell 1 becomes equal to or lower than a predetermined value. Therefore, the bypass circuit 3 connected in parallel to the connection unit 2 formed by the solar cell 1 is conducted, and an electromotive voltage from the connection unit 2 does not contribute to the system voltage V. Consequently, the system voltage V becomes V2, which is lower than V1.

When the bypass circuit 3 connected in parallel to the connection unit 2 formed by the solar cell 1 in which a failure occurs is conducted, a current also flows to the attenuating circuit 4 within the bypass circuit 3, and the periodic signals 20 and 21 transmitted from the transmitting circuit 14 are attenuated by the attenuating circuit 4 and reach the receiving circuit 15.

Assume that an attenuation characteristic of the attenuating circuit 4 at a solar battery string 7B side is set such that an attenuation amount is large in the frequency F2 and an attenuation amount is small in the frequency F1. The receiving circuit 15 then detects that an amplitude of the periodic signal 20 transmitted from the transmitting circuit 14 is ΔV1a and that an amplitude of the periodic signal 21 is ΔV2 (ΔV1a>ΔV2).

In the embodiment shown in FIG. 1, the solar battery strings 7A and 7B are in parallel in two rows, and the periodic signal 21 passes through the attenuating circuits 4 of the solar battery string 7B and is attenuated, but does not pass through the attenuating circuits 4 of the solar battery string 7A and is not attenuated. Therefore, the amplitude ΔV2 of the periodic signal 21 when a failure occurs in the solar cell 1 of the solar battery string 7B becomes about a half of the amplitude AV1 of the periodic signal 21 when a failure does not occur in the solar cell 1 of the solar battery string 7A.

When it is determined that an attenuation amount of the periodic signal 21 exceeds a prescribed value as a result of a detection that the amplitude of the periodic signal 21 is ΔV2, the determining circuit 19 can determine that direct-current power is conducted to any of the bypass circuits 3 of the solar battery string 7B, and can determine that there is an unrecoverable failure in any of the solar battery modules 6 of the solar battery string 7B.

When it is determined that an attenuation amount of the periodic signal 20 does not exceed a prescribed value as a result of a detection that the amplitude of the periodic signal 20 is ΔV1a, the determining circuit 19 can determine that direct-current power is not conducted to any of the bypass circuits 3 of the solar battery string 7A, and can determine that there is no unrecoverable failure in any of the solar battery modules 6 of the solar battery string 7A.

To prevent an erroneous determination that the solar battery 6 has a failure when the amount of solar radiation decreases, it can be determined for the periodic signal 20 such that direct-current power is conducted to any of the bypass circuits 3 of the solar battery string 7A when an amplitude is continuously attenuated by a prescribed value or more during a period from the time T1 to T2 (a period of T2-T1), and it can be determined for the periodic signal 21 such that direct-current power is conducted to any of the bypass circuits 3 of the solar battery string 7B when an amplitude is continuously attenuated by a prescribed value or more during a period from the time T3 to T4 (a period of T4-T3).

A determination of power conduction to the bypass circuit 3 by a transmission of a periodic signal from the transmitting circuit 14 to the power line 8 and by a detection of a periodic signal by the receiving circuit 15 can be always performed during power generation by the solar power generation device, or can be regularly performed such as at every certain time, at every hour, or everyday, or can be temporarily performed according to a request.

A communication circuit (not shown) can be provided in the inverter 12 or the like. When it is determined that there is an unrecoverable failure or a possibility of a failure in the solar battery module 6, this state information can be communicated to a company or the like that performs maintenance via a public line such as a telephone line, a power-line communication network, a radio communication network, or the Internet. Alternatively, determination information that direct-current power is conducted to the bypass circuit 3 can be regularly communicated to a company or the like that performs maintenance, thereby asking the company or the like that performs maintenance to determine presence of a failure. Alternatively, the above determination information can be returned according to a regular or irregular request from a company that performs maintenance. By the above arrangement, maintenance such as replacement of the solar battery module 6 and a detailed check can be performed properly and promptly with economy.

When a lowpass filter is used for the attenuating circuit 4 and when the frequency F1 and the frequency F2 are near to each other, both frequencies F1 and F2 are attenuated by the same attenuating circuit 4 and it becomes impossible to determine which one of the solar battery strings 7A and 7B has a failure when the solar battery string 7A has no failure and only the solar battery string 7B has a failure. Therefore, preferably, a difference between the frequency F1 and the frequency F2 is set such that an attenuation amount of the frequency F1 and that of the frequency F2 by the attenuating circuit 4 can be discriminated from each other.

Further, for example, when a failure of the solar battery string 7B is detected and a certain solar battery module 6 of the solar battery string 7B is replaced with a good product, and also when a failure of the solar battery string 7B is detected again, it can be determined that the replaced solar battery module 6 has no failure and another solar battery module 6 of the solar battery string 7B has a failure.

When the attenuating circuits 4 that attenuate periodic signals of the same frequency are provided in the different solar battery strings 7A and 7B, it becomes impossible to identify the solar battery string 7A or 7B in which power is conducted to the bypass circuit 3. Therefore, by providing the attenuating circuits 4 at least capable of attenuating different periodic signals in the solar battery strings 7A and 7B, the solar battery string 7A or 7B including the conducted bypass circuit 3 can be identified. When the attenuating circuits 4 capable of attenuating periodic signals different between the solar battery modules 6 are provided, the solar battery module 6 including the conducted bypass circuit 3 can be identified.

Figure 4:
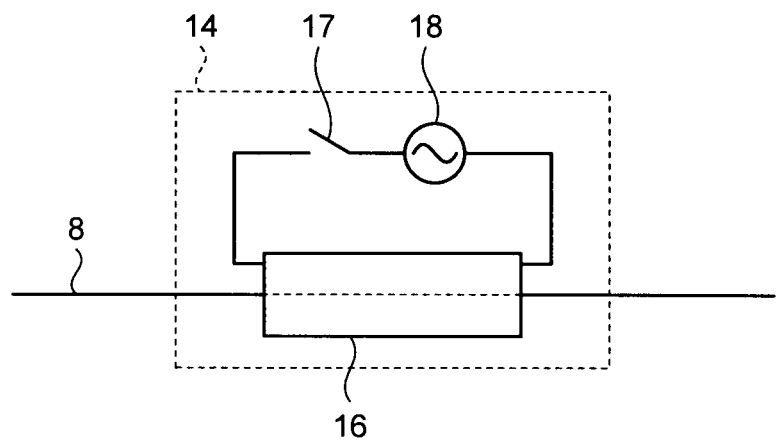
FIG. 4 is a block diagram of a configuration example of a transmitting circuit 14 shown in FIG. 1.

FIG. 4 is a block diagram of a configuration example of the transmitting circuit 14 shown in FIG. 1. In FIG. 4, the transmitting circuit 14 includes a coil 16 arranged to cover the power line 8, a periodic power source 18 that supplies to the coil 16 a current of which an amplitude changes cyclically, and a transmitting switch 17 that turns ON/OFF a current flowing through the coil 16. The periodic power source 18 can change a frequency of a current supplied to the coil 16, and can supply currents of the frequencies F1 and F2 to the coil 16, for example.

The transmitting switch 17 is ON from the time T1 to T2 and from the time T3 to T4 in FIG. 2. The periodic power source 18 can set a frequency of a current at F1 from the time T1 to T2, and can set a frequency of a current at F2 from the time T3 to T4.

From T1 to T2, the transmitting switch 17 is ON, and a current of the frequency F1 is supplied to the coil 16 and the periodic signal 20 is superimposed on the power line 8 by electromagnetic induction of the coil 16. From T3 to T4, the transmitting switch 17 is ON, and a current of the frequency F2 is supplied to the coil 16 and the periodic signal 21 is superimposed on the power line 8 by electromagnetic induction of the coil 16.

In the example of FIG. 4, a method of generating currents of the frequencies F1 and F2 by one periodic power source 18 to superimpose the periodic signals 20 and 21 on the power line 8 is explained. Alternatively, separate periodic power sources 18 can generate currents of the frequencies F1 and F2. The transmitting circuit 14 is not limited to a configuration of indirectly superimposing the periodic signals 20 and 21 on the power line 8 by electromagnetic induction, but can have a configuration of directly superimposing the periodic signals 20 and 21 on the power line 8. For example, a switching element of cyclically turning ON/OFF can be provided in the middle of the power line 8, or a separate power source can be connected to the power line 8 via a switching element.

Figure 5:
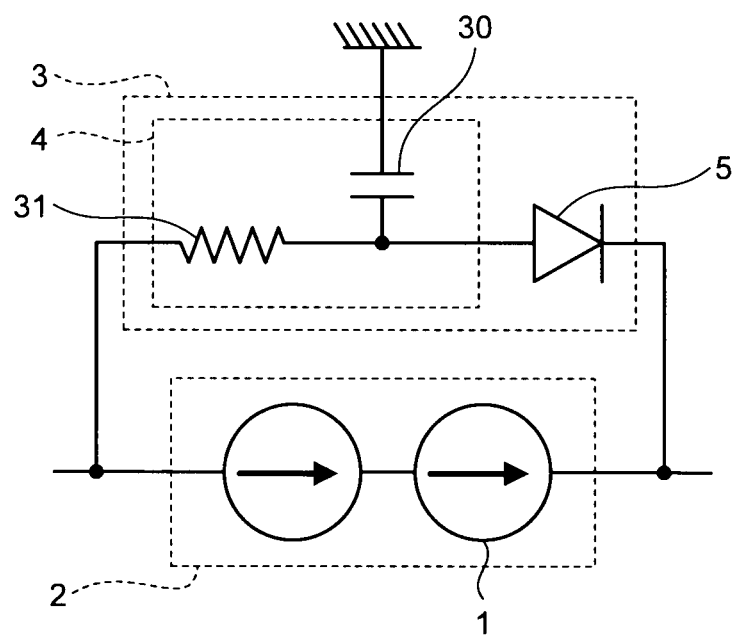
FIG. 5 is a block diagram of a first configuration example of an attenuating circuit 4 shown in FIG. 1.

FIG. 5 is a block diagram of a first configuration example of the attenuating circuit 4 shown in FIG. 1. In FIG. 5, a capacitor 30 and a resistor 31 are provided in the attenuating circuit 4. The resistor 31 is connected in series to the bypass diode 5, and the capacitor 30 is connected between a terminal of the resistor 31 and a ground, thereby forming a lowpass filter.

When a frequency of a periodic signal is 5 kHz, when an electrostatic capacitance of the capacitor 30 is 50 μF, and when a resistance value of the resistor 31 is 5Ω, an attenuation voltage ratio of a periodic signal in the attenuating circuit 4 can be set at about ⅛ of an input voltage.

Figure 6:
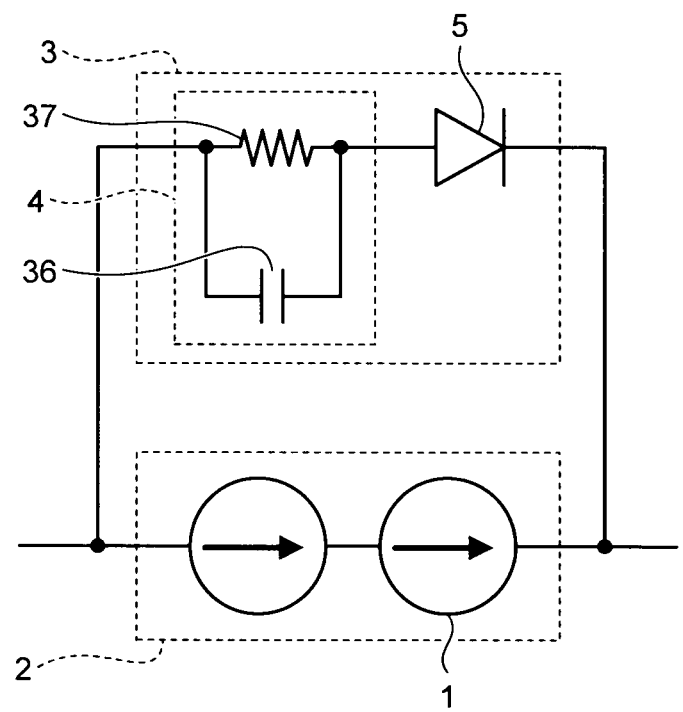
FIG. 6 is a block diagram of a second configuration example of the attenuating circuit 4 shown in FIG. 1.

(Attenuation voltage ratio)=1/(1+(2πx(frequency)× (electrostatic capacitance)×(resistance value))$^2$)$^{0.5}$ FIG. 6 is a block diagram of a second configuration example of the attenuating circuit 4 shown in FIG. 1. In FIG. 6, a capacitor 36 and a resistor 37 are provided in the attenuating circuit 4. The resistor 37 is connected in series to the bypass diode 5, and the capacitor 36 is connected in parallel to the resistor 37, thereby forming a lowpass filter.

As explained above, according to the solar power generation device according to the first embodiment, the transmitting circuit 14 and the receiving circuit 15 are provided in the middle of the power line 8, and the attenuating circuit 4 of a simple configuration is provided in the middle of the bypass circuit 3, thereby achieving a detection of a failure in the solar power generation device. Therefore, the arrangement freedom and installability of a failure detecting unit are high. A failure can be detected easily at low cost. A periodic signal can be always securely superimposed on the power line 8, and a conduction operation of direct-current power to the bypass circuit 3 can be stably and securely detected.

By determining that direct-current power is conducted to the bypass circuit 3 when it is continuously detected for at least a certain time that an amplitude of a periodic signal received by the receiving circuit 15 is attenuated by a certain amount or more from a predetermined amplitude, an erroneous determination due to momentary noise or the like can be suppressed, and determination precision of a conduction operation of direct-current power to the bypass circuit 3 can be improved.

The transmitting circuit 14 is caused to transmit a periodic signal regularly or temporarily only for a certain time, and the receiving circuit 15 receives the periodic signal during this time. When an amplitude of the received periodic signal is attenuated by a certain amount or more from a predetermined amplitude, it is determined that direct-current power is conducted to the bypass circuit 3. With this arrangement, the power consumption required to generate the periodic signal can be suppressed.

Periodic signals of plural frequencies are superimposed on the power line 8, and attenuation bands of the attenuating circuits 4 corresponding to frequencies of the periodic signals are differentiated between the bypass circuits 3. With this arrangement, the bypass circuit 3 to which direct-current power is conducted can be easily identified, and the solar battery module 6 in which a failure occurs can be easily identified.

When periodic signals of plural frequencies are superimposed on the power line while separating the periodic signals on the timeline, as compared with when plural frequencies are simultaneously superimposed, separation and identification of the periodic signals can be facilitated, determination precision of a conduction operation of direct-current power to the bypass circuit 3 can be improved, and the bypass circuit 3 to which direct-current power is conducted can be identified more easily.

In the first embodiment, although a method of using a lowpass filter for the attenuating circuit 4 is explained, any kind of attenuating circuit capable of attenuating a periodic signal can be used, such as a highpass filter that attenuates a periodic signal of a frequency lower than a certain frequency and a bandpass filter that passes only a periodic signal of a certain range of frequencies.

In the first embodiment described above, although a method of superimposing periodic signals of plural frequencies on the power line 8 by separating the periodic signals on the timeline is explained, periodic signals having plural frequencies multiplexed can be superimposed on the power line 8 without separating periodic signals of plural frequencies on the timeline. With this arrangement, a determination time of a conduction operation of direct-current power to the bypass circuit 3 can be shortened. Because a determination can be performed at the same time, an influence of a variation of a condition of solar radiation and the like can be minimized. Therefore, determination precision can be improved.

In the first embodiment described above, although a method of using a sinusoidal wave signal for a periodic signal is explained, a periodic signal is not limited to a sinusoidal wave signal and can be a triangular wave or a rectangular wave signal. A periodic signal can be a half wave signal having an amplitude in upper or lower directions instead of a wave having a uniform amplitude in upper and low directions from a center voltage.

In the first embodiment described above, although a method of always providing the transmitting circuit 14 and the receiving circuit 15 in the power line 8 is explained, the transmitting circuit 14 and the receiving circuit 15 can be arranged to be temporarily provided in the power line 8 only at the time of superimposing a periodic signal or receiving a signal. For example, the transmitting circuit 14 and the receiving circuit 15 can be arranged to be temporarily provided in the power line 8 only when a test operation is performed to the solar power generation device.

Second Embodiment

Figure 7:
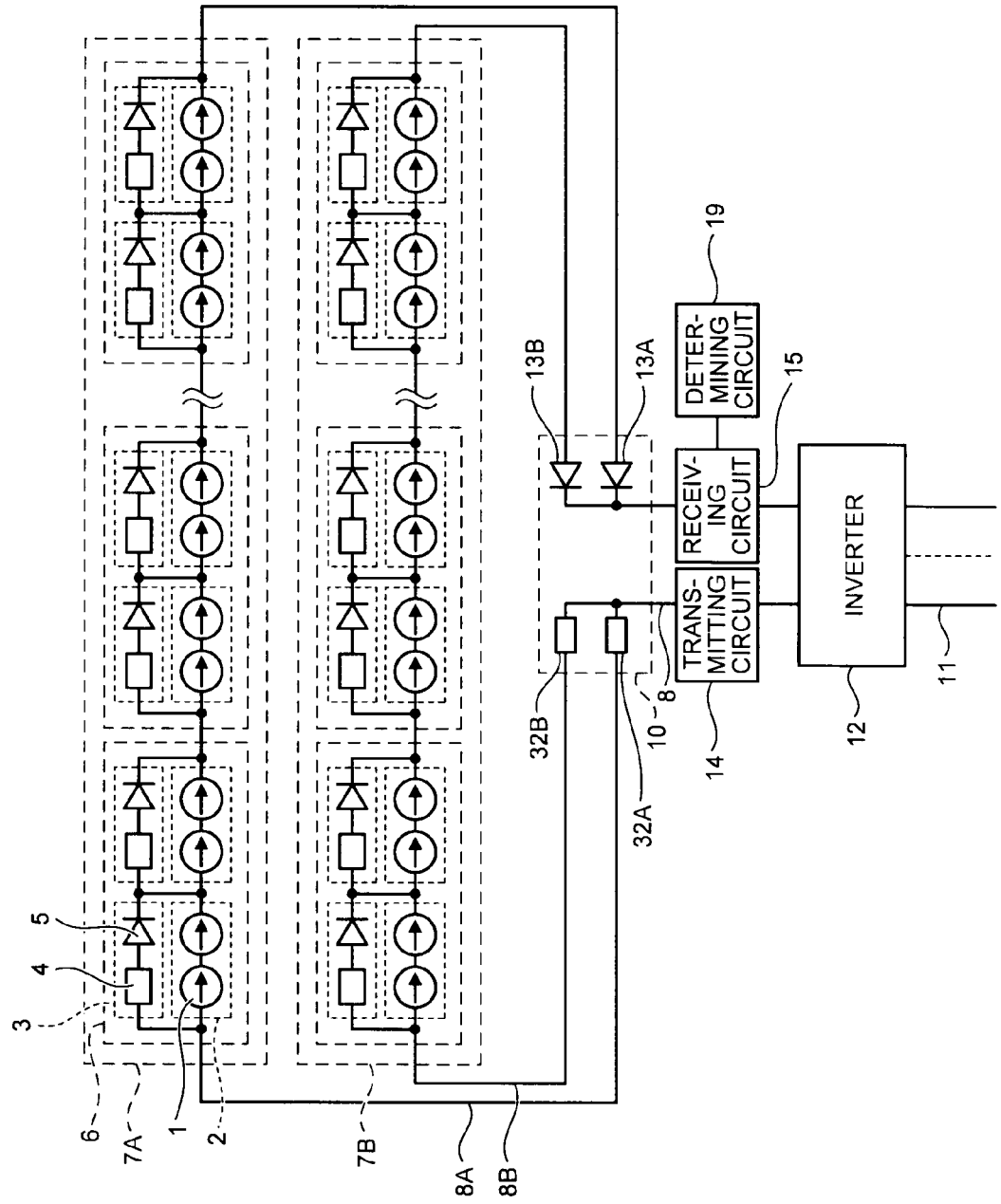
FIG. 7 is a block diagram of a schematic configuration of a solar power generation device according to a second embodiment of the present invention.

FIG. 7 is a block diagram of a schematic configuration of a solar power generation device according to a second embodiment of the present invention. In FIG. 7, attenuating circuits 32A and 32B are provided in addition to a configuration of the solar power generation device shown in FIG. 1. A bandpass filter that passes only a periodic signal of a certain range of frequencies can be used for the attenuating circuits 32A and 32B. The attenuating circuit 32A is connected to the power line 8A at a current flow-in side to the solar battery string 7A, and the attenuating circuit 32B is connected to the power line 8B at a current flow-in side to the solar battery string 7B. Frequency bands of periodic signals capable of passing the attenuating circuits 32A and 32B can be differentiated from each other. The attenuating circuit 32A can only pass a frequency band of the periodic signal attenuated by the attenuating circuit 4 at a solar battery string 7A side, and the attenuating circuit 32B can only pass a frequency band of the periodic signal attenuated by the attenuating circuit 4 at a solar battery string 7B side.

Assume that the periodic signals 20 and 21 of the frequencies F1 and F2 in FIG. 2 are transmitted from the transmitting circuit 14 to the power line 8, that the attenuating circuit 4 at a solar battery string 7A side is set with an attenuation characteristic such that a periodic signal of the frequency F1 is attenuated, and that the attenuating circuit 4 at a solar battery string 7B side is set with an attenuation characteristic such that a periodic signal of the frequency F2 is attenuated. In this case, an attenuation characteristic is set in the attenuating circuit 32A such that a periodic signal of the frequency F2 is attenuated without attenuating a periodic signal of the frequency F1 as far as possible, and an attenuation characteristic is set in the attenuating circuit 32B such that a periodic signal of the frequency F1 is attenuated without attenuating a periodic signal of the frequency F2 as far as possible.

Preferably, frequency ranges of periodic signals attenuated by the attenuating circuits 4 included in plural in the solar battery strings 7A and 7B respectively are completely separated without being overlapped.

When the periodic signals 20 and 21 having the frequencies F1 and F2 in FIG. 2 are transmitted from the transmitting circuit 14 to the power line 8, the attenuating circuit 32A attenuates the periodic signal 21 of the frequency F2, and the periodic signal 20 of the frequency F1 is mainly input to the solar battery string 7A via the power line 8A, and the attenuating circuit 32B attenuates the periodic signal 20 of the frequency F1, and the periodic signal 21 of the frequency F2 is mainly input to the solar battery string 7B via the power line 8B.

When there is no failure in any solar cell 1 of the solar battery strings 7A and 7B, the periodic signal 20 input to the solar battery string 7A passes through the solar battery string 7A without passing through the attenuating circuit 4, and is input to the receiving circuit 15 via the power line 8. The periodic signal 21 input to the solar battery string 7B passes through the solar battery string 7B without passing through the attenuating circuit 4, and is input to the receiving circuit 15 via the power line 8. When the receiving circuit 15 detects that attenuation amounts of the periodic signals 20 and 21 transmitted from the transmitting circuit 14 are substantially zero excluding attenuation components by the attenuating circuits 32A and 32B, the determining circuit 19 determines that direct-current power is not conducted to any of the bypass circuits 3 of the solar battery strings 7A and 7B, and determines that there is no unrecoverable failure in any of the solar battery modules 6 of the solar battery strings 7A and 7B.

In contrast, when a failure such as a disconnection occurs in a certain solar cell 1 of any of the solar battery modules 6 of the solar battery string 7A, the attenuating circuit 4 within the bypass circuit 3 connected in parallel to the connection unit 2 formed by the solar cell 1 is conducted. Therefore, the periodic signal 20 of the frequency F1 passing through the attenuating circuit 32A reaches the receiving circuit 15 via the attenuating circuit 4 within the bypass circuit 3 connected in parallel to the connection unit 2 formed by the solar cell 1 in which the failure occurs.

Meanwhile, in the power line 8B at a solar battery string 7B side, the periodic signal 20 of the frequency F1 is attenuated by the attenuating circuit 32B. Therefore, the periodic signal 20 of the frequency F1 reaching the receiving circuit 15 via the power line 8B at the solar battery string 7B side can be substantially disregarded.

Consequently, the receiving circuit 15 detects that an attenuation amount of the periodic signal 20 of the frequency F1 passing through the attenuating circuit 32A exceeds a prescribed value. When the attenuation amount of the periodic signal 20 of the frequency F1 exceeds a prescribed value, the determining circuit 19 determines that direct-current power is conducted to any of the bypass circuits 3 of the solar battery string 7A, and determines that there is an unrecoverable failure in any of the solar battery modules 6 of the solar battery string 7A.

When a failure such as a disconnection occurs in a certain solar cell 1 of any of the solar battery modules 6 of the solar battery string 7B, the attenuating circuit 4 within the bypass circuit 3 connected in parallel to the connection unit 2 formed by the solar cell 1 is conducted. Therefore, the periodic signal 21 of the frequency F2 passing through the attenuating circuit 32B reaches the receiving circuit 15 via the attenuating circuit 4 within the bypass circuit 3 connected in parallel to the connection unit 2 formed by the solar cell 1 in which the failure occurs.

Meanwhile, in the power line 8A at a solar battery string 7A side, the periodic signal 21 of the frequency F2 is attenuated by the attenuating circuit 32A. Therefore, the periodic signal 21 of the frequency F2 reaching the receiving circuit 15 via the power line 8A at the solar battery string 7A side can be substantially disregarded.

Consequently, the receiving circuit 15 detects that an attenuation amount of the periodic signal 21 of the frequency F2 passing through the attenuating circuit 32B exceeds a prescribed value. When the attenuation amount of the periodic signal 21 of the frequency F2 exceeds a prescribed value, the determining circuit 19 determines that direct-current power is conducted to any of the bypass circuits 3 of the solar battery string 7B, and determines that there is an unrecoverable failure in any of the solar battery modules 6 of the solar battery string 7B.

With this arrangement, when the transmitting circuit 14 is provided in common to the solar battery strings 7A and 7B, frequency bands of periodic signals input to the solar battery strings 7A and 7B, respectively can be also differentiated, and thus mixing by the receiving circuit 15 of periodic signals of the same frequency band passing through the solar battery strings 7A and 7B, respectively can be decreased. Therefore, an attenuation rate of the periodic signal 20 that can be detected by the receiving circuit 15 when the bypass circuit 3 including the attenuating circuit 4 included in the solar battery string 7A is conducted, for example, can be increased. Determination of a conduction operation of direct-current power to the bypass circuit 3 can be performed separately for the solar battery strings 7A and 7B. Consequently, determination precision of a detection of a failure can be improved when many solar battery strings are connected in parallel.

Third Embodiment

Figure 8:
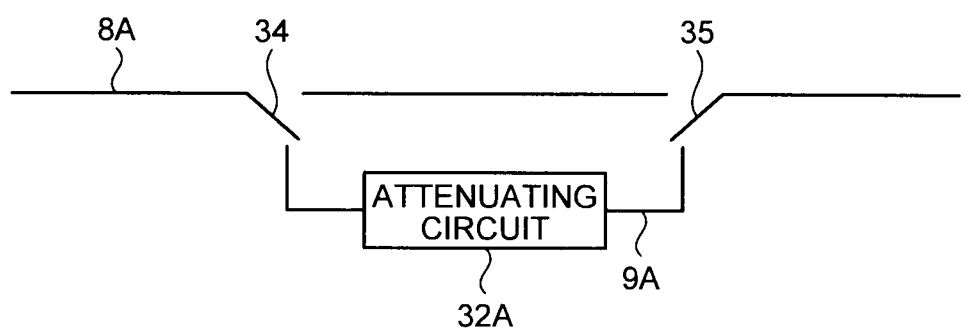
FIG. 8 is a block diagram of a configuration example of a bypass power line 9 applied to a solar power generation device according to a third embodiment of the present invention.

FIG. 8 is a block diagram of a configuration example of a bypass power line 9A applied to a solar power generation device according to a third embodiment of the present invention. In FIG. 8, changeover switches 34 and 35 and the bypass power line 9A that bypasses the attenuating circuit 32A on the power line 8A are provided at an input side and an output side of the attenuating circuit 32A, respectively. A similar configuration can be also provided in the attenuating circuit 32B.

The attenuating circuits 32A and 32B can be temporarily conducted by changing over the changeover circuits 34 and 35 to sides of the attenuating circuits 32A and 32B when transmitting the periodic signals 20 and 21 to the solar battery strings 7A and 7B.

With this arrangement, the attenuating circuits 32A and 32B can be conducted only when a failure check of the solar cell 1 is performed. Because constant conduction to the attenuating circuits 32A and 32B can be prevented, a conduction loss can be suppressed, and circuit degradation can be prevented.

For the transmitting circuit 14 and the receiving circuit 15 shown in FIG. 7, when the periodic signals 20 and 21 are transmitted to the attenuating circuits 32A and 32B by providing changeover switches and a bypass power line to bypass the transmitting circuit 14 and the receiving circuit 15 on the power line 8, respectively, the transmitting circuit 14 and the receiving circuit 15 can be temporarily conducted by switching the changeover switches to the sides of the transmitting circuit 14 and the receiving circuit 15.

Fourth Embodiment

FIG. 9 is a block diagram of a schematic configuration of a solar power generation device according to a fourth embodiment of the present invention. In FIG. 9, this solar power generation device includes switches 33A and 33B and a control circuit 41 that performs a switch control of the switches 33A and 33B, in addition to the configuration of the solar power generation device shown in FIG. 1. Mechanical switches can be used or electronic switching elements such as transistors can be used for the switches 33A and 33B. The switch 33A is connected to the power line 8A at the current flow-in side to the solar battery string 7A, and the switch 33B is connected to the power line 8B at the current flow-in side to the solar battery string 7B. The switch 33A can be connected to the power line 8A at the current flow-out side to the solar battery string 7A, and the switch 33B can be connected to the power line 8B at the current flow-out side to the solar battery string 7B.

When the switches 33A and 33B are provided, a periodic signal transmitted from the transmitting circuit 14 can be arranged to have only a single frequency component, and the attenuating circuits 4 having the same attenuation characteristic can be arranged to be used in the solar battery strings 7A and 7B. For example, attenuation characteristics of the attenuating circuits 4 of the solar battery strings 7A and 7B can be set as common such that a periodic signal of the frequency F1 is attenuated by providing the frequency of F1 shown in FIG. 2 in the periodic signal.

When the switches 33A and 33B are provided, a transmission signal transmitted from the transmitting circuit 14 is not necessarily limited to a periodic signal, and can be a single or plural nonperiodic pulse signals. In this case, the attenuating circuit 4 can be formed by a lowpass filter that attenuates a pulse signal.

In a normal power generation state, the control circuit 41 closes all the switches 33A and 33B to set the power lines 8A and 8B in a conductive state. When a conduction operation of the bypass circuits 3 of the solar battery strings 7A and 7B is determined, the control circuit 41 closes only one of the switches 33A and 33B provided on the power lines 8A and 8B, respectively, thereby setting one of the power lines 8A and 8B in a conductive state.

When a conduction operation of the bypass circuit 3 of the solar battery string 7A is to be determined, for example, the control circuit 41 closes the switch 33A and opens the switch 33B.

When the periodic signal 20 having the frequency F1 in FIG. 2 is transmitted from the transmitting circuit 14 to the power line 8, the periodic signal 20 is input to the solar battery string 7A via the switch 33A.

When there is no failure in any of the solar cells 1 of the solar battery string 7A, the periodic signal 20 input to the solar battery string 7A passes through the solar battery string 7A without passing through the attenuating circuit 4, and is input to the receiving circuit 15 via the power line 8. When the receiving circuit 15 detects that an attenuation amount of the periodic signal 20 transmitted from the transmitting circuit 14 is substantially zero, the determining circuit 19 determines that direct-current power is not conducted to any of the bypass circuits 3 of the solar battery string 7A, and determines that there is no unrecoverable failure in any of the solar battery modules 6 of the solar battery string 7A.

In contrast, when a failure occurs in any of solar cells 1 of the solar battery string 7A, the attenuating circuit 4 within the bypass circuit 3 connected in parallel to the connection unit 2 formed by the solar cell 1 is conducted. Therefore, the periodic signal 20 of the frequency F1 transmitted from the transmitting circuit 14 reaches the receiving circuit 15 via the attenuating circuit 4 within the bypass circuit 3 connected in parallel to the connection unit 2 formed by the solar cell 1 in which the failure occurs.

When the periodic signal 20 of the frequency F1 passing via the attenuating circuit 4 reaches the receiving circuit 15, the receiving circuit 15 detects that an attenuation amount of the periodic signal 20 of the frequency F1 exceeds a prescribed value. When it is detected that an attenuation amount of the periodic signal 20 of the frequency F1 exceeds a prescribed value, the determining circuit 19 determines that direct-current power is conducted to any of the bypass circuits 3 of the solar battery string 7A, and determines that there is an unrecoverable failure in any of the solar battery modules 6 of the solar battery string 7A.

When a conduction operation of the bypass circuit 3 of the solar battery string 7A is to be determined, the switch 33B is already opened, and therefore the periodic signal 20 of the frequency F1 is prevented from reaching the receiving circuit 15 via the power line 8B at the solar battery string 7B side. Consequently, even when the transmitting circuit 14 and the receiving circuit 15 are provided in common to the solar battery strings 7A and 7B, mixing of the periodic signal 20 of the frequency F1 passing through the solar battery strings 7A and 7B, respectively by the receiving circuit 15 can be decreased. Because a determination of a conduction operation of direct-current power to the bypass circuit 3 can be performed separately for the solar battery strings 7A and 7B, determination precision of a failure detection can be improved. Because a frequency of a periodic signal does not need to be changed for each of the solar battery strings 7A and 7B, a configuration can be provided at lower cost.

When a conduction operation of the bypass circuit 3 of the solar battery string 7B is to be determined, the control circuit 41 opens the switch 33A and closes the switch 33B.

When the periodic signal 20 having the frequency F1 in FIG. 2 is transmitted from the transmitting circuit 14 to the power line 8, the periodic signal 20 is input to the solar battery string 7B via the switch 33B.

When there is no failure in any of the solar cells 1 of the solar battery string 7B, the periodic signal 20 input to the solar battery string 7B passes through the solar battery string 7B without passing through the attenuating circuit 4, and is input to the receiving circuit 15 via the power line 8. When the receiving circuit 15 detects that an attenuation amount of the periodic signal 20 transmitted from the transmitting circuit 14 is substantially zero, the determining circuit 19 determines that direct-current power is not conducted to any of the bypass circuits 3 of the solar battery string 7B, and determines that there is no unrecoverable failure in any of the solar battery modules 6 of the solar battery string 7B.

In contrast, when a failure occurs in any of solar cells 1 of the solar battery string 7B, the attenuating circuit 4 within the bypass circuit 3 connected in parallel to the connection unit 2 formed by the solar cell 1 is conducted. Therefore, the periodic signal 20 of the frequency F1 transmitted from the transmitting circuit 14 reaches the receiving circuit 15 via the attenuating circuit 4 within the bypass circuit 3 connected in parallel to the connection unit 2 formed by the solar cell 1 in which the failure occurs.

When the periodic signal 20 of the frequency F1 passing via the attenuating circuit 4 reaches the receiving circuit 15, the receiving circuit 15 detects that an attenuation amount of the periodic signal 20 of the frequency F1 exceeds a prescribed value. When it is detected that an attenuation amount of the periodic signal 20 of the frequency F1 exceeds a prescribed value, the determining circuit 19 determines that direct-current power is conducted to any of the bypass circuits 3 of the solar battery string 7B, and determines that there is an unrecoverable failure in any of the solar battery modules 6 of the solar battery string 7B.

When a conduction operation of the bypass circuit 3 of the solar battery string 7B is to be determined, because the switch 33A is in an open state, the periodic signal 20 of the frequency F1 is prevented from reaching the receiving circuit 15 via the power line 8A at the solar battery string 7A side. Consequently, determination precision of a detection of a failure can be improved.

In the fourth embodiment described above, an example is explained in which attenuation characteristics of the attenuating circuits 4 of the solar battery strings 7A and 7B are set such that periodic signals of one kind of the frequency F1 are attenuated after setting the frequency of F1 in the periodic signals. Alternatively, after setting M kinds of frequencies F1 to FM in periodic signals corresponding to M solar battery modules in each of the solar battery strings 7A and 7B, attenuation characteristics of the attenuating circuits 4 of the M solar battery modules of each of the solar battery strings 7A and 7B can be set such that the periodic signals of the frequencies F1 to FM are attenuated.

In the first to fourth embodiments described above, although it is explained that numbers of the solar cells 1 within the connection unit 2, the connection units 2 within the solar battery module 6, and the solar battery modules 7A and 7B within the solar power generation device, respectively are two, these numbers are not limited to two, and can be one, three, or more. Although the number of the solar battery modules 6 within the solar battery strings 7A and 7B is three or more in the above embodiments, the number can be one or two.

Industrial Applicability

As described above, the solar power generation device according to the present invention is suitable for a method of detecting a failure of a solar battery module in which an abnormal solar cell can be bypassed via a bypass circuit.

The invention claimed is:

1. A solar power generation device comprising:
one or more solar cells electrically connected in series or in parallel to form a connection unit; and
a bypass circuit that is connected in parallel to the connection unit and performs a conduction operation by bypassing the connection unit when electromotive force of the connection unit is equal to or lower than a predetermined value, wherein
a solar battery string is formed by electrically connecting in series one or more solar battery modules, each of which is equipped with one or more sets of combination of the connection unit and the bypass circuit, and the solar battery string is connected by a power line, and
the solar power generation device further comprises:
a transmitting circuit connected in series with and upstream of the solar battery string, the transmitting circuit transmitting transmission signal of a predetermined amplitude through the solar battery string;
a receiving circuit connected in series with and downstream of the solar battery string, the receiving unit receiving the transmitted transmission signal after the transmission signal passes through the solar battery string;
an attenuating circuit that is provided in the bypass circuit and attenuates an amplitude of the transmission signal, wherein
the transmission signal includes plural frequency components, each frequency component being attenuated by a bypass circuit in a different one of the solar battery modules in the solar battery string when direct-current power is conducted by the respective bypass circuit.

2. The solar power generation device according to claim 1, further comprising a determining circuit that determines that, when it is detected that an amplitude of a transmission signal received by the receiving circuit is attenuated by a predetermined value or more, direct-current power is conducted to the bypass circuit.

3. The solar power generation device according to claim 2, wherein the determining circuit determines that, when the receiving circuit detects continuously for a certain time or more that an amplitude of a received transmission signal is attenuated by a predetermined value or more, direct-current power is conducted to the bypass circuit.

4. The solar power generation device according to claim 2, wherein
the attenuating circuit includes:
a first attenuating circuit that is provided in a first bypass circuit connected in parallel to a first connection unit and attenuates a first frequency; and
a second attenuating circuit that is provided in a second bypass circuit connected in parallel to a second connection unit and attenuates a second frequency different from the first frequency,
the transmission signal includes a first periodic signal having the first frequency and a second periodic signal having the second frequency, and
the determining circuit determines that, when it is detected that an amplitude of a first periodic signal received by the receiving circuit is attenuated by a predetermined value or more, direct-current power is conducted to the first bypass circuit, and determines that, when it is detected that an amplitude of a second periodic signal received by the receiving circuit is attenuated by a predetermined value or more, direct-current power is conducted to the second bypass circuit.

5. The solar power generation device according to claim 4, wherein the transmitting circuit transmits the first periodic signal and the second periodic signal to the power line in a time-sharing manner.

6. The solar power generation device according to claim 4, wherein
the first attenuating circuit is provided in a bypass circuit of a solar battery module that forms a first solar battery string, and the second attenuating circuit is provided in a bypass circuit of a solar battery module that forms a second solar battery string, and
the solar power generation device further comprises:
a third attenuating circuit that is provided on a first power line connected to the first solar battery string, passes the first periodic signal, and attenuates the second periodic signal; and
a fourth attenuating circuit that is provided on a second power line connected to the second solar battery string, passes the second periodic signal, and attenuates the first periodic signal.

7. The solar power generation device according to claim 1, further comprising:
a first switch that turns ON/OFF conduction of a first power line connected to a first solar battery string;
a second switch that turns ON/OFF conduction of a second power line connected to a second solar battery string; and
a control circuit that controls a switch operation of the first and second switches such that conduction of the second power line is disconnected only for a certain time when the first power line is conductive, and conduction of the first power line is disconnected only for a certain time when the second power line is conductive.

8. The solar power generation device according to claim 1, wherein the transmitting circuit regularly or temporarily transmits the transmission signal to the power line only for a certain time.

9. The solar power generation device according to claim 1, wherein
the solar power generation device includes plural solar battery strings, each formed by one or more solar battery modules connected in series, and
the solar battery strings are connected in parallel with each other with corresponding power lines.

10. The solar power generation device according to claim 9, wherein
each of the plural battery strings receives the transmission signal, and
the transmission signal includes plural frequency components, each frequency component being isolated by an attenuating circuit of a different one of the battery strings.

11. The solar power generation device according to claim 1, wherein the transmission signal transmitted by the transmitting circuit passes through the entirety of the solar battery string prior to being received in the receiving circuit.

\* \* \* \* \*